United States Patent
Ozawa et al.

(10) Patent No.: US 7,956,518 B2
(45) Date of Patent: Jun. 7, 2011

(54) PIEZOELECTRIC/ELECTROSTRICTIVE CERAMIC COMPOSITION AND PIEZOELECTRIC/ELECTROSTRICTIVE DEVICE

(75) Inventors: Shuichi Ozawa, Nagoya (JP); Hirofumi Yamaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 217 days.

(21) Appl. No.: 12/244,144

(22) Filed: Oct. 2, 2008

(65) Prior Publication Data

US 2009/0091214 A1   Apr. 9, 2009

(30) Foreign Application Priority Data

Oct. 3, 2007 (JP) .................. 2007-259706
Sep. 5, 2008 (JP) .................. 2008-227991

(51) Int. Cl.
*H01L 41/08* (2006.01)
(52) U.S. Cl. ..................... 310/358; 310/311
(58) Field of Classification Search .......... 310/358, 310/359, 311; 252/62.9 PZ, 62.9 R; *H01L 41/083, H01L 47/187*
See application file for complete search history.

(56) References Cited

U.S. PATENT DOCUMENTS

| | | | |
|---|---|---|---|
| 2006/0006360 A1 * | 1/2006 | Takao et al. | 252/62.9 R |
| 2006/0202170 A1 | 9/2006 | Koizumi et al. | |
| 2007/0200084 A1 * | 8/2007 | Wang et al. | 252/62.9 R |

FOREIGN PATENT DOCUMENTS

| | | | |
|---|---|---|---|
| EP | 1 382 588 A1 | | 1/2004 |
| EP | 1 796 183 A1 | | 6/2007 |
| EP | 1857425 | * | 11/2007 |
| JP | 50-047193 A1 | | 4/1975 |
| JP | 56-120180 A1 | | 9/1981 |
| JP | 2003-206179 A1 | | 7/2003 |
| JP | 2003-300776 | | 10/2003 |
| JP | 2004-155601 | | 6/2004 |
| JP | 2004-244299 A1 | | 9/2004 |
| JP | 2004-244302 | | 9/2004 |
| WO | 2006/095716 A1 | | 9/2006 |

* cited by examiner

*Primary Examiner* — Walter Benson
*Assistant Examiner* — Karen Addison
(74) *Attorney, Agent, or Firm* — Burr & Brown

(57) ABSTRACT

The invention provides a (Li, Na, K)(Nb, Ta, Sb)$O_3$ type piezoelectric/electrostrictive ceramic composition excellent in the electric field-induced strain at the time of high electric field application. The piezoelectric/electrostrictive film of a piezoelectric/electrostrictive actuator is a sintered body of a piezoelectric/electrostrictive ceramic composition. The piezoelectric/electrostrictive ceramic composition comprises a perovskite type oxide comprising as A site elements, Li, Na, and K and as B site elements, Nb and Sb and having a ratio of the total number of atoms of the A site elements to the total number of atoms of the B site elements greater than 1 and not less than 1 mol % and not more than 10 mol % of the number of Sb atoms in the total number of atoms of the B site elements and a Mn compound added to said perovskite type oxide.

15 Claims, 7 Drawing Sheets

PIEZOELECTRIC/ELECTROSTRICTIVE CERAMIC COMPOSITION AND PIEZOELECTRIC/ELECTROSTRICTIVE DEVICE

BACKGROUND OF THE INVENTION

1. Field of the Invention

The invention relates to a piezoelectric/electrostrictive ceramic composition and a piezoelectric/electrostrictive device using the piezoelectric/electrostrictive ceramic composition.

2. Description of the Background Art

A piezoelectric/electrostrictive actuator has an advantage of being able to precisely control a displacement in submicron order. Particularly, a piezoelectric/electrostrictive actuator using a sintered body of a piezoelectric/electrostrictive ceramic composition as a piezoelectric/electrostrictive body can precisely control a displacement and additionally has advantages of high electric-mechanical conversion efficiency, high motive power, fast response speed, high durability, and low electric power consumption and using these advantages, the actuator is used for heads of ink jet printers, injectors of diesel engines, and the like.

As a piezoelectric/electrostrictive ceramic composition for piezoelectric/electrostrictive actuators, conventionally $Pb(Zr,Ti)O_3$ (PZT)-type piezoelectric/electrostrictive ceramic compositions have been employed; however the effect of the elution of lead from sintered bodies on the global environments has become a serious concern and since then, $(Li, Na, K)(Nb, Ta)O_3$ type piezoelectric/electrostrictive ceramic composition has been investigated.

Further, as Japanese Patent Application Laid-Open (JP-A) No. 2003-206179 and JP-A No. 2004-244299 disclose, $(Li, Na, K)(Nb, Ta, Sb)O_3$ type piezoelectric/electrostrictive ceramic compositions has also been investigated containing Sb as the B site element for improving the piezoelectric/electrostrictive properties.

Furthermore, International Publication No. 2006/095716 discloses that the piezoelectric/electrostrictive properties can be improved by the excess number of atoms of the A site element over that of the B site element in $(Li, Na, K)(Nb, Ta, Sb)O_3$ type piezoelectric/electrostrictive ceramic compositions.

However, the conventional $(Li, Na, K)(Nb, Ta, Sb)O_3$ type piezoelectric/electrostrictive ceramic compositions have problems that electric field-induced strain under high electric field application is not always sufficient, which is important as piezoelectric/electrostrictive actuators.

SUMMARY OF THE INVENTION

The invention relates to a piezoelectric/electrostrictive ceramic composition and a piezoelectric/electrostrictive device using the piezoelectric/electrostrictive ceramic composition.

According to the first aspect of the invention, the piezoelectric/electrostrictive ceramic composition comprises: a perovskite type oxide comprising Li, Na, and K as A site elements, Nb and Sb and as B site elements, having a ratio of the total number of atoms of the A site elements to the total number of atoms of the B site elements greater than 1, and having the number of Sb atoms not less than 1 mol % and not more than 10 mol % relative to the total number of atoms of the B site elements and; a Mn compound added to the perovskite type oxide.

Accordingly, a $(Li, Na, K)(Nb, Ta, Sb)O_3$ type piezoelectric/electrostrictive ceramic composition excellent in an electric field-induced strain under of high electric field application can be provided.

According to the second aspect of the invention, the piezoelectric/electrostrictive ceramic composition comprises: a perovskite type oxide having a composition defined by a general formula: $\{Li_y(Na_{1-x}K_x)_{1-y}\}_a(Nb_{1-z-w}Ta_zSb_w)O_3$ wherein a, x, y, z, and w respectively satisfy $1<a\leq1.05$, $0.30\leq x\leq0.70$, $0.02\leq y\leq0.10$, $0\leq z\leq0.5$, and $0.01\leq w\leq0.1$; and a Mn compound added to the perovskite type oxide.

Accordingly, a $(Li, Na, K)(Nb, Ta, Sb)O_3$ type piezoelectric/electrostrictive ceramic composition excellent in the electric field-induced strain under high electric field application can be provided.

According to the third aspect of the invention, the piezoelectric/electrostrictive ceramic composition comprises: a perovskite type oxide comprising Li, Na, and K as A site elements, and Nb and Sb as B site elements, and having a ratio of the total number of atoms of the A site elements to the total number of atoms of the B site elements greater than 1 and a Mn compound added to the perovskite type oxide, in which for two main peaks derived from the perovskite type compound and observed in a range of $2\theta=44$ to $47°$ in an X-ray diffraction pattern using Cu—K$\alpha$ beam as an X-ray source, the ratio of the d-spacing calculated from the peak of the lower angle to the d-spacing calculated from the peak of the higher angle e is not less than 1.003 and not more than 1.025.

Accordingly, a $(Li, Na, K)(Nb, Ta, Sb)O_3$ type piezoelectric/electrostrictive ceramic composition excellent in the electric field-induced strain under high electric field application can be provided.

The invention also relates to a piezoelectric/electrostrictive device comprising a piezoelectric/electrostrictive film of a sintered body of the piezoelectric/electrostrictive ceramic composition and electrode films.

Accordingly, the aim of the invention is to provide a $(Li, Na, K)(Nb, Ta, Sb)O_3$ type piezoelectric/electrostrictive ceramic composition excellent in the electric field-induced strain under high electric field application.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
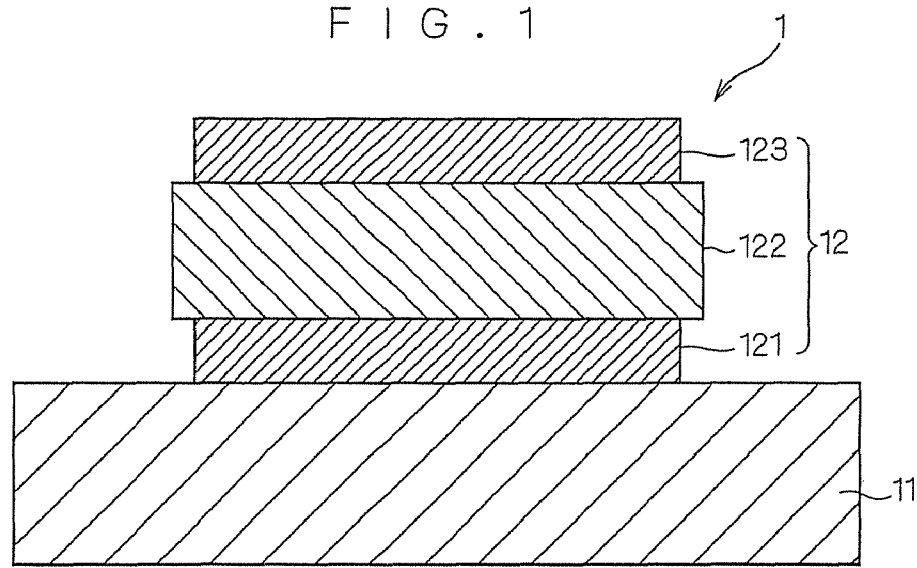
FIGS. 1 to 3 are cross-sectional views of piezoelectric/electrostrictive actuators.

Hereinafter, a piezoelectric/electrostrictive ceramic composition according to a preferred embodiment of the invention will be described and thereafter, an actuator using the piezoelectric/electrostrictive ceramic composition will be described. However, the following explanations do not necessarily mean that the application of the piezoelectric/electrostrictive ceramic composition of the invention is limited to an actuator. For example, the piezoelectric/electrostrictive ceramic composition of the invention may be used for piezoelectric/electrostrictive devices such as sensors.

<1: Piezoelectric/Electrostrictive Ceramic Composition>

{Composition}

A piezoelectric/electrostrictive ceramic composition according to a preferred embodiment of the invention contains a perovskite type oxide containing lithium (Li), sodium (Na), and potassium (K) as A site elements, and niobium (Nb) and antimony (Sb) as B site elements, and having a ratio of the total number of atoms of the A site elements to the total number of atoms of the B site elements (so-called A/B ratio) greater than 1 and a very small amount of a Mn compound added to said perovskite type oxide. Additionally, as an A site element, a monovalent elements such as silver (Ag) may be added to the perovskite type oxide and pentavalent elements such as tantalum (Ta) and vanadium (V) may be added further as a B site element.

The composition of the perovskite type oxide as a main component is preferably defined by a general formula: $\{Li_y(Na_{1-x}K_x)_{1-y}\}_a(Nb_{1-z-w}Ta_zSb_w)O_3$, wherein a, x, y, z, and w satisfy $1<a\leq1.05$, $0.30\leq x\leq0.70$, $0.02\leq y\leq0.10$, $0\leq z\leq0.5$, and $0.01\leq w\leq0.1$ respectively.

The reason for the definition of A/B ratio to be $1<a$ is to promote the grain growth and the densification. The composition having A/B ratio of $1\geq a$ require heating at 1100° C. or higher to promote the grain growth. In this case, evaporation of alkaline components tends to be caused and the properties become unstable due to fluctuation of the composition. A/B ratio of $1<a$ allows the firing temperature to be 1100° C. or lower and thereby composition fluctuation can be suppressed. This is probably attributed to the production of a hetero-phase (low melting point phase) in the firing process caused by the existence of excess alkaline components.

On the other hand, that A/B ratio is defined to be $a\leq1.05$ is because if it exceeds the range, dielectric loss tends to increase and the electric field-induced strain tends to be low under high electric field application. Increase in the dielectric loss is a serious problem for the piezoelectric/electrostrictive ceramic composition for actuators to which the high electric field is applied.

That the Sb substitution amount is defined to be $0.01\leq w\leq0.1$ is because in this range, the electric field-induced strain can be increased under high electric field application without considerably fluctuating the tetragonal orthorhombic phase transition temperature (hereinafter, simply referred to as "phase transition temperature") $T_{OT}$ (desirably 50° C. or lower) at which the piezoelectric/electrostrictive property is enhanced. Particularly, in the case the Sb substitution amount is defined as $0.01\leq w\leq0.05$, the electric field-induced strain under high electric field application can be increased particularly almost without fluctuating the phase transition temperature $T_{OT}$ (desirably 10° C. or lower). That is because a hetero-phase of $LiSbO_3$ is produced inside of the sintered body and it becomes impossible to obtain perovskite single phase and the phase transition temperature $T_{OT}$ tends to increase if A/B ratio is $1<a$ and Sb substitution amount exceeds the range of $0.01\leq w\leq0.05$.

That the amounts of K, Li, and Ta are defined to be $0.30\leq x\leq0.70$, $0.02\leq y\leq0.10$, and $0\leq z\leq0.5$, respectively, is because these ranges allows a suitable piezoelectric/electrostrictive ceramic composition desirable for actuators to be obtained.

For example, if x is below the range, the piezoelectric/electrostrictive property is significantly lowered. On the other hand, if x exceeds the range, sintering becomes difficult and the firing temperature has to be higher. The high firing temperature is undesirable because the high firing temperature causes the evaporation of the alkaline components contained in the piezoelectric/electrostrictive ceramic composition and makes it impossible to obtain the stable piezoelectric/electrostrictive property.

Further, if y is below the range, all the same, sintering becomes difficult and the firing temperature has to be higher. On the other hand, if y exceeds the range, the hetero-phase precipitation is increased to result in decrease of the electric insulation.

Furthermore, if z exceeds the range, all the same, sintering becomes difficult and the firing temperature has to be higher.

The Mn compound, an auxiliary component, is desirable to be added in an amount of not more than 3 parts by mole on the basis of Mn atoms relative to 100 parts by mole of the perovskite type oxide. That the addition amount of the Mn compound is defined to be not more than 3 parts by mole is because if it exceeds the range, the dielectric loss is increased and the electric field-induced strain under high electric field application tends to be small.

Herein, the addition amount of the Mn compound is sufficient even if it is a very small amount. For example, even if the Mn compound is added in an amount of only 0.001 parts by mole on the basis of Mn atoms relative to the 100 parts by mole to the perovskite type oxide, the polarization treatment of the sintered body becomes easy and due to the synergetic effect with the substitution with Sb, the electric field-induced strain under high electric field application can be increased.

The Mn compound is desirably a compound of Mn having primarily an atomic valence of divalence. For example, manganese oxide (MnO) and other compounds into which manganese is solid-solved are desirable, and a compound of trilithium niobate ($Li_3NbO_4$) into which manganese is solid-solved is particularly desirable. Herein, "mainly divalent" means that a compound of Mn having an atomic valence other than divalence may be included and that the most included atomic valence is divalence. The atomic valence of Mn can be confirmed by X-ray absorption near-edge structure (XANES). Further, Mn is desirable to exist as an element constituting the hetero-phase of a manganese compound inside the ceramic sintered body without being incorporated in the crystal lattice of the perovskite type oxide, which is the mother phase.

Introduction of such a Mn compound into the inside of the sintered body can prevent hardening due to the addition of the Mn compound and increase the electric field-induced strain.

{Phase Transition Temperature}

Generally, the (Li, Na, K)(Nb, Ta, Sb)$O_3$ type perovskite oxide and its modified compounds show phase transition successively from cubic system, to tetragonal system and orthorhombic system in this order with the temperature change from high to low. With respect to the piezoelectric/electrostrictive ceramic composition according to a preferred embodiment of the invention, composition is preferably selected so that the phase transition temperature $T_{OT}$ is near a room temperature, and more preferably, very close to a room temperature. It is because if the phase transition temperature $T_{OT}$ is near a room temperature, the electric field-induced strain under high electric field application can be increased. Herein, the phase transition temperature is defined as a temperature at which the dielectric constant has an extremal value. (The first peak is defined as a cubic system-tetragonal system phase transition temperature and the second peak is defined as a tetragonal system-orthorhombic system phase transition temperature in the case the temperature is decreased from a high temperature and the peaks are slightly different between the case of decreasing the temperature and the case of increasing the temperature. Herein, the tetragonal system-orthorhombic system phase transition temperature in the case of increasing the temperature is defined as $T_{OT}$.

{Crystal System and Lattice Strain}

Further, with respect to the piezoelectric/electrostrictive ceramic composition of a desirable embodiment of the invention, preferably composition is selected so that the crystal system is tetragonal system or orthorhombic system and the lattice strain is suppressed to a certain slight extent. Practically, the composition is preferably selected so that for two main peaks derived from the perovskite type compound and observed in a range of $2\theta=44$ to $47°$ in an X-ray diffraction pattern using Cu—Kα beam as an X-ray source, the ratio of the d-spacing calculated from the peak of the lower angle to the d-spacing calculated from the peak of the higher angle is not less than 1.003 and not more than 1.025. Herein, in the case the crystal system is the tetragonal system, the d-spacing calculated from the peak of higher angle corresponds to the d-spacing of the (200) plane and the d-spacing calculated from the peak of lower angle corresponds to the d-spacing of the (002) plane, and the ratio means the ratio c/a of the lattice constant c in the c-axis direction to the lattice constant a in the a-axis direction. That is, in the case the crystal system is tetragonal system, it is desirable to select the composition in such a manner that c/a is 1.003 or higher and 1.025 or lower. That is because if the d-spacing is in these ranges, the rotation of domains becomes easy and the electric field-induced strain under high electric field application can be improved.

{Production of Ceramic Powder}

In the production of a ceramic powder of the piezoelectric/electrostrictive ceramic composition, at first, starting materials of component elements (Li, Na, K, Nb, Ta, Sb, Mn, and the like) of the piezoelectric/electrostrictive ceramic composition are mixed with a dispersion medium and stirred by a ball mill or the like. As the starting materials, compounds such as oxides, carbonates, and tartaric acid salts may be used and as the dispersion medium, an organic solvent such as ethanol, toluene, acetone and the like may be used. Thereafter, the dispersion mesium is removed from the obtained mixed slurry by a technique such as evaporation drying and filtration to obtain a starting material mixture. Successively, the starting material mixture is calcined at 600 to 1300° C. to obtain a ceramic powder. In order to obtain a ceramic powder with a desired particle diameter, the ceramic powder may be pulverized after calcination by a ball mill or the like. Further, the ceramic powder may be produced not by the solid-phase reaction method but by an alkoxide method or a coprecipitation method. Further, after the perovskite type oxide is synthesized, a starting material of Mn for supplying Mn composing the Mn compound may be added. In this case, it is desirable to add manganese dioxide ($MnO_2$) as the Mn compound to the synthesized perovskite type oxide. The tetravalent Mn constituting manganese dioxide added in such a manner is reduced to be divalent Mn during the sintering and it contributes to improvement of the electric field-induced strain. Further, the perovskite type oxide may be synthesized via a columbite compound of the B site element.

The average particle diameter of the ceramic powder is preferably 0.07 to 10 μm and more preferably 0.1 to 3 μm. To adjust the particle diameter of the ceramic powder, the ceramic powder may be thermally treated at 400 to 850° C. Since finer particles are united more easily with other particles, execution of the thermal treatment gives a ceramic powder with uniform particle diameter and thus a sintered body with uniform grain diameter can be obtained.

<2 Piezoelectric/Electrostrictive Actuator>

{Entire Structure}

Figure 2:
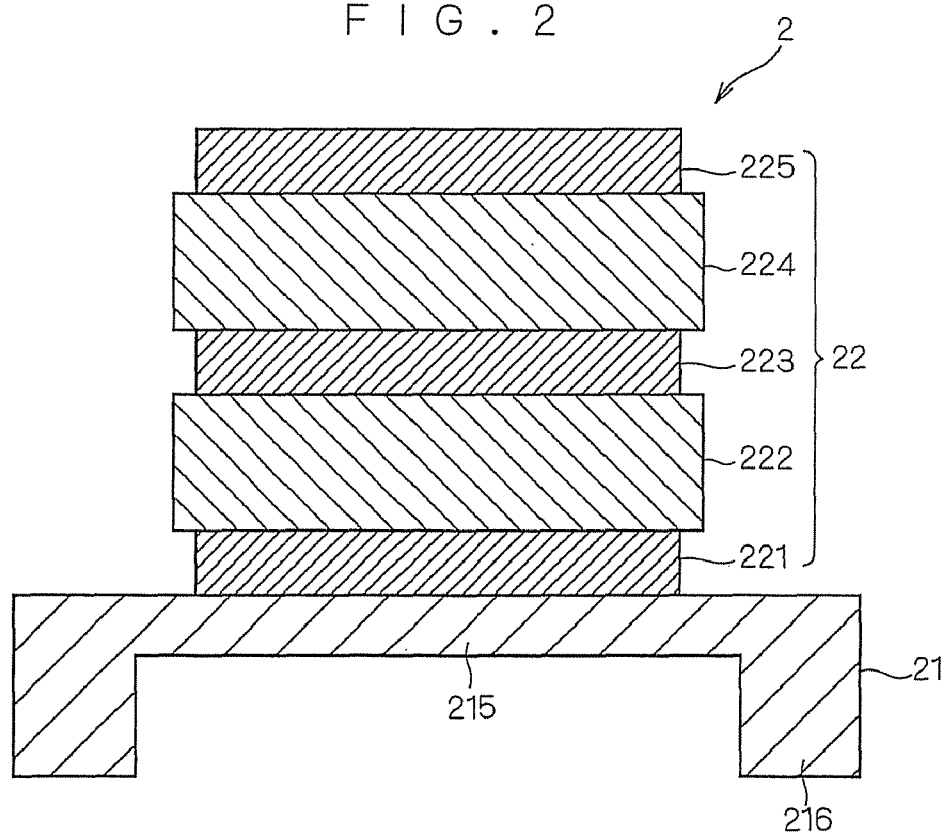

FIG. 1 and FIG. 2 are schematic drawings of structure examples of piezoelectric/electrostrictive actuators 1 and 2 using the above-mentioned piezoelectric/electrostrictive ceramic composition and FIG. 1 shows a cross-sectional view of a monolayer type piezoelectric/electrostrictive actuator 1 and FIG. 2 shows a cross-sectional view of a multilayer type piezoelectric/electrostrictive actuator 2.

As shown in FIG. 1, the piezoelectric/electrostrictive actuator 1 has a structure formed by layering an electrode film 121, a piezoelectric/electrostrictive film 122, and an electrode film 123 on the upper face of a substrate 11 in this order. The electrode films 121 and 123 on both main faces of the piezoelectric/electrostrictive film 122 are opposed together while sandwiching the piezoelectric/electrostrictive film 122. The laminate body 12 of the electrode film 121, the piezoelectric/electrostrictive film 122, and the electrode film 123 is firmly stuck to the substrate 11.

Further, as shown in FIG. 2, the piezoelectric/electrostrictive actuator 2 has a structure formed by layering an electrode film 221, a piezoelectric/electrostrictive film 222, an electrode film 223, a piezoelectric/electrostrictive film 224, and an electrode film 225 on the upper face of a substrate 21 in this order. The electrode films 221 and 223 on both main faces of the piezoelectric/electrostrictive film 222 are opposed together while sandwiching the piezoelectric/electrostrictive film 222 and the electrode films 223 and 225 on both main faces of the piezoelectric/electrostrictive film 224 are opposed together while sandwiching the piezoelectric/electrostrictive film 224. The laminate body 22 of the electrode film 221, the piezoelectric/electrostrictive film 222, the electrode film 223, the piezoelectric/electrostrictive film 224, and the electrode film 225 is firmly stuck to the substrate 21. Although FIG. 2 shows the case in which the structure has two piezoelectric/electrostrictive films, it may have three or more piezoelectric/electrostrictive films.

Herein, "firmly stuck" means the laminated bodies 12 and 22 are joined to the substrates 11 and 21 by solid-phase reaction in the interfaces of the substrates 11 and the laminate bode 12, and that of substrate 21 and the laminated body 22 without using an organic adhesive or an inorganic adhesive. In addition, a laminated body may be joined to a substrate by solid-phase reaction in the interface of the substrate and the piezoelectric/electrostrictive film that is the lowest layer of the laminated body.

In the piezoelectric/electrostrictive actuators 1 and 2, when voltage is applied, the piezoelectric/electrostrictive bodies 122, 222, and 224 are contracted or extended in the vertical direction of the electric field, depending on the applied voltage and as a result, flexion displacement occurs.

{Piezoelectric/Electrostrictive Film}

The piezoelectric/electrostrictive films 122, 222, and 224 are sintered bodies of the above-mentioned piezoelectric/electrostrictive ceramic composition.

The thickness of the piezoelectric/electrostrictive films 122, 222, and 224 is preferably 0.5 to 50 μm, more preferably 0.8 to 40 μm, and even more preferably 1 to 30 μm. That is because if it is below the range, the densification tends to be insufficient. Further, that is also because if it exceeds the range, the shrinkage stress in a sintering process tends to be significant and thus the thickness of the substrates 11 and 21 has to be thick and it becomes difficult to miniaturize the piezoelectric/electrostrictive actuators 1 and 2.

{Electrode Film}

Materials of the electrode films 121, 123, 221, 223, and 225 may be metals such as platinum, palladium, rhodium, gold, or silver, or their alloys. Among them, in terms of the high resistance to heat in a firing process, platinum or an alloy containing mainly platinum is preferred. Further, depending on the firing temperature, a silver-palladium alloy or the like also may be suitable to be used.

The thickness of the electrode films 121, 123, 221, 223, and 225 is preferably 15 μm or less and more preferably 5 μm or less. That is because if it exceeds the range, the electrode films 121, 123, 221, 223, and 225 work as a buffer layer and the flexion displacement tends to be small. Further, for proper performance of the function of the electrode films 121, 123, 221, 223, and 225, the thickness is preferably 0.05 μm or more.

The electrode films 121, 123, 221, 223, and 225 are preferably formed so as to cover the regions substantially contributing to the flexion displacement of the piezoelectric/electrostrictive films 122, 222, and 224. For example, they are preferably formed so as to cover the region of 80% or more of both main faces of the piezoelectric/electrostrictive films 122, 222, and 224 including the center portion of the piezoelectric/electrostrictive films 122, 222, and 224.

{Substrate}

Materials for the substrates 11 and 21 are ceramic, however types thereof are not limited. Nevertheless, in terms of the resistance to heat, chemical stability, and electric insulation, ceramics containing at least one component selected from a group consisting of stabilized zirconium oxide, aluminum oxide, magnesium oxide, mullite, aluminum nitride, silicon nitride, and glass are preferred. Especially, in terms of the mechanical strength and toughness, stabilized zirconium oxide is further preferred. Herein, "stabilized zirconium oxide" means zirconium oxide whose crystal phase transition is suppressed by adding a stabilizing agent and include stabilized zirconium oxide and additionally partially stabilized zirconium oxide.

Examples of the stabilized zirconium oxide include zirconium oxide containing 1 to 30 mol % of calcium oxide, magnesium oxide, yttrium oxide, ytterbium oxide, cerium oxide or oxides of rare earth metals as a stabilizing agent. Especially, in terms of high mechanical strength, zirconium oxide containing yttrium oxide as a stabilizing agent is preferred. The content of yttrium oxide is preferably 1.5 to 6 mol % and more preferably 2 to 4 mol %. Further, in addition to the yttrium oxide, 0.1 to 5 mol % of aluminum oxide is also preferably included. The crystal phase of stabilized zirconium oxide may be a mixed crystal of the cubic and the monoclinic, a mixed crystal of the tetragonal and the monoclinic, or a mixed crystal of the cubic, the tetragonal, and the monoclinic, however it is preferred that the main crystal phase is a mixed crystal of the tetragonal and the cubic or the tetragonal in terms of the mechanical strength, toughness, and durability.

The thickness of the substrates 11 and 21 is preferably 1 to 1000 μm, more preferably 1.5 to 500 μm, and even more preferably 2 to 200 μm. That is because if it is below the range, the mechanical strength of the piezoelectric/electrostrictive actuators 1 or 2 tends to be decreased. Further, that is also because if it exceeds the range, the rigidity of the substrates 11 and 21 becomes high and the flexion displacement due to contraction and expansion of the piezoelectric/electrostrictive films 122, 222, and 224 tends to be small when applying voltage.

The surface shape of the substrates 11 and 21 (the shape of the face to which the laminated body is stuck) is not particularly limited and may be triangular, quadrangular (rectangular, regular tetragonal), elliptical, or circular and the triangular shape and quadrangular shape may be rounded in the corners. A composite shape formed by combining these basic shapes may be also allowed.

The thickness of the substrate 11 of the monolayer type piezoelectric/electrostrictive actuator 1 is even. On the other hand, the thickness of the substrate 21 of the multilayer type piezoelectric/electrostrictive actuator 2 is thinner in the center part to which the laminated body 22 is stuck than in the peripheries 216. This results in a large flexion displacement while maintaining the mechanical strength of the substrate 21. The substrate 21 may be used for the monolayer type piezoelectric/electrostrictive actuator 1.

Figure 3:
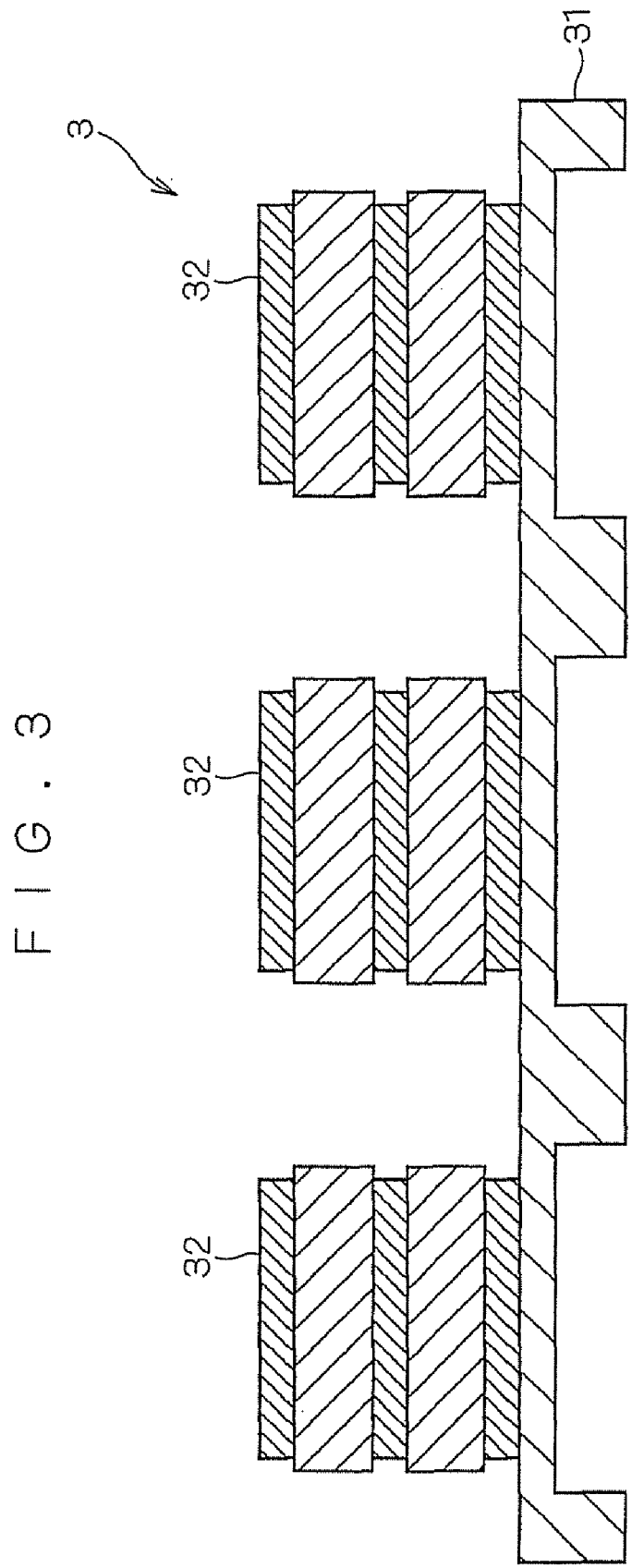

As shown in the cross-sectional view of FIG. 3, a substrate 31 formed by repeating unit structures may be used using the substrate 21 shown in FIG. 2 as a unit structure. In this case, a laminated body 32 is firmly stuck on each unit structure to construct the piezoelectric/electrostrictive actuator 3.

{Production of piezoelectric/Electrostrictive Actuator}

In the case of production of the monolayer type piezoelectric/electrostrictive actuator 1, the electrode film 121 is at first formed on the substrate 11. The electrode film 121 may be formed by a method such as ion beam, sputtering, vacuum deposition, PVD (Physical Vapor Deposition), ion plating, CVD (Chemical Vapor Deposition), plating, aerosol deposition, screen printing, spraying or dipping. Especially, in terms of adhesion of the substrate 11 and the piezoelectric/electrostrictive film 122, the sputtering method and the screen printing method are preferred. The formed electrode film 121 can be firmly stuck to the substrate 11 and the piezoelectric/electrostrictive film 122 by the heat treatment. The heat treatment temperature varies depending on the material and formation method of the electrode film 121, however it is approximately 500 to 1400° C.

Successively, the piezoelectric/electrostrictive film 122 is formed on the electrode film 121. The piezoelectric/electrostrictive film 122 can be formed by a method such as ion beam, sputtering, vacuum deposition, PVD (Physical Vapor Deposition), ion plating, CVD (Chemical Vapor Deposition), plating, aerosol deposition, screen printing, spraying or dipping. Especially, in terms of high precision of plane shape and thickness and continuous formability of the piezoelectric/electrostrictive film, a screen printing method is preferred.

Successively, an electrode film 123 is formed further on the piezoelectric/electrostrictive film 122. The electrode film 123 can be formed in the same manner as the electrode film 121.

Thereafter, the substrate 11 on which the laminated body 12 is formed is fired monolithically. Sintering of the piezoelectric/electrostrictive film 122 and the heat treatment of the electrode films 121 and 123 is promoted by this firing. The firing temperature of the piezoelectric/electrostrictive film 122 is preferably 800 to 1250° C. and more preferably 900 to 1200° C. That is because if it is below this range, densification of the piezoelectric/electrostrictive film 122 becomes insufficient and firm bonding of the substrate 11 and the electrode film 121 and the firm bonding of the electrode films 121 and 123 and the piezoelectric/electrostrictive film 122 tend to be incomplete. Further, if it exceeds this range, the piezoelectric/electrostrictive property of the piezoelectric/electrostrictive film 122 tends to be deteriorated. The retention time of the highest temperature during the firing is preferably 1 minute to 10 hours and more preferably 5 minutes to 4 hours. That is because if it below this range, densification of the piezoelectric/electrostrictive film 122 becomes insufficient. Further, if it exceeds this range, the piezoelectric/electrostrictive property of the piezoelectric/electrostrictive film 122 tends to be deteriorated.

In addition, the heat treatment of the electrode films 121 and 123 is preferably carried out together with firing in terms of productivity, and it does not inhibit execution of heat treatment every time after formation of the electrode films 121 and 123. However, in the case the piezoelectric/electrostrictive film 122 is fired before the heat treatment of the electrode film 123, the electrode film 123 is thermally treated at a lower temperature than the firing temperature of the piezoelectric/electrostrictive film 122.

On completion of the firing, polarization treatment is carried out under proper conditions. The polarization treatment can be carried out by conventionally known technique and although depending on the Curie temperature of the piezoelectric/electrostrictive film 122, it is preferable to be carried out by heating to 40 to 200° C.

The multilayer type piezoelectric/electrostrictive actuator 2 can also be produced similarly to the monolayer type piezoelectric/electrostrictive actuator 1, except that the numbers of the piezoelectric/electrostrictive films and the electrode films to be formed are increased.

The piezoelectric/electrostrictive actuator 1 can be produced by a green sheet lamination method, which is employed commonly in the production of laminated ceramic electronic parts. In the green sheet lamination method, at first, a binder, a plasticizer, a dispersant, and dispersion medium are added to the ceramic powder and mixed by a ball mill or the like. The obtained slurry is formed into a sheet shape by a doctor blade method or the like to obtain a formed body.

Successively, films of an electrode paste are printed on both main faces of the formed body by a screen printing method or the like. The electrode paste to be used is obtained by adding a solvent, a vehicle, and glass frit to a powder of the above-mentioned metal or alloy.

Further continuously, the formed body on which the films of the electrode paste are formed on both main faces and a substrate are bonded by press bonding.

Thereafter, the substrate on which the laminated body is formed is monolithically fired and on completion of the firing, polarization treatment is carried out under proper conditions.

<3 Another Example of Piezoelectric/Electrostrictive Actuator>

Figure 4:
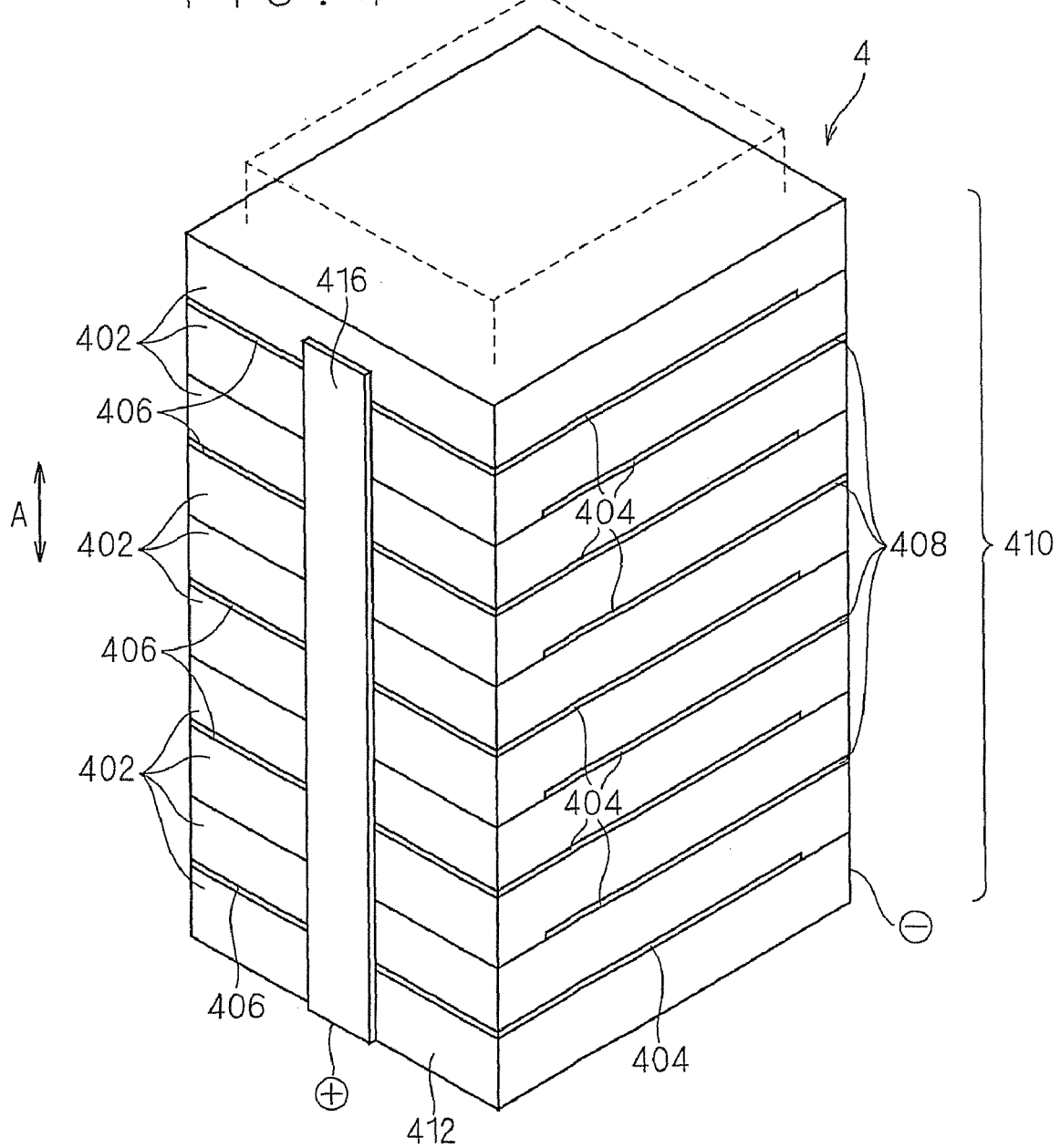
FIG. 4 is a perspective view of a piezoelectric/electrostrictive actuator.
Figure 5:
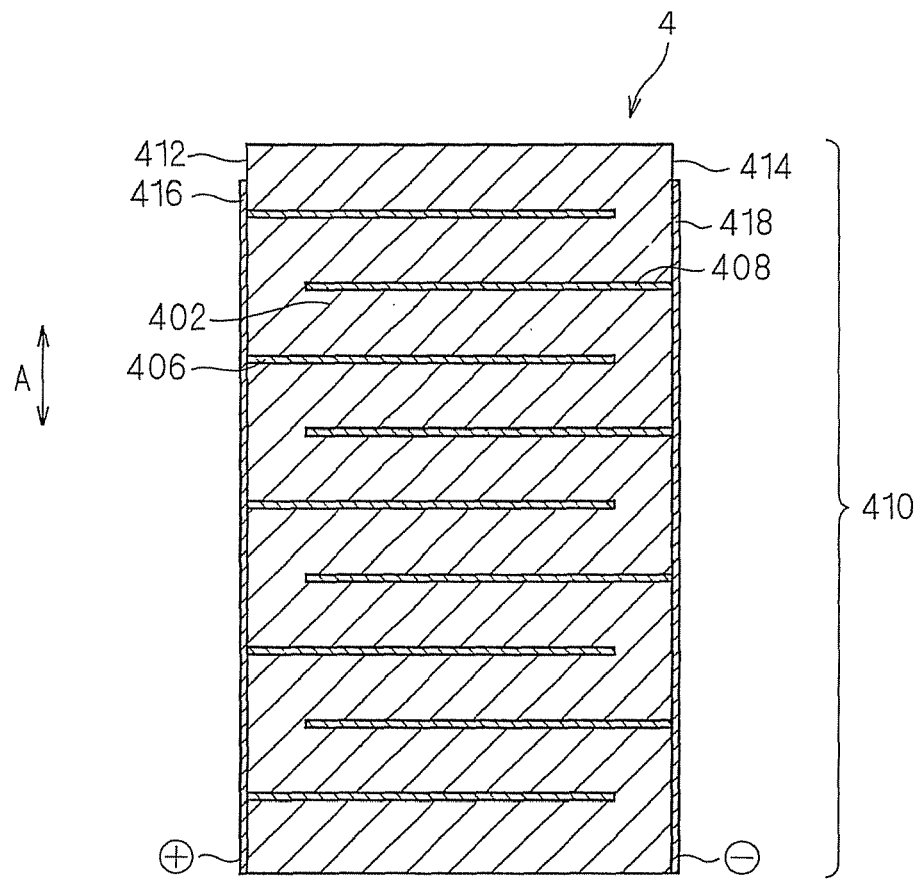
FIG. 5 is a longitudinal sectional view of a piezoelectric/electrostrictive actuator.
Figure 6:
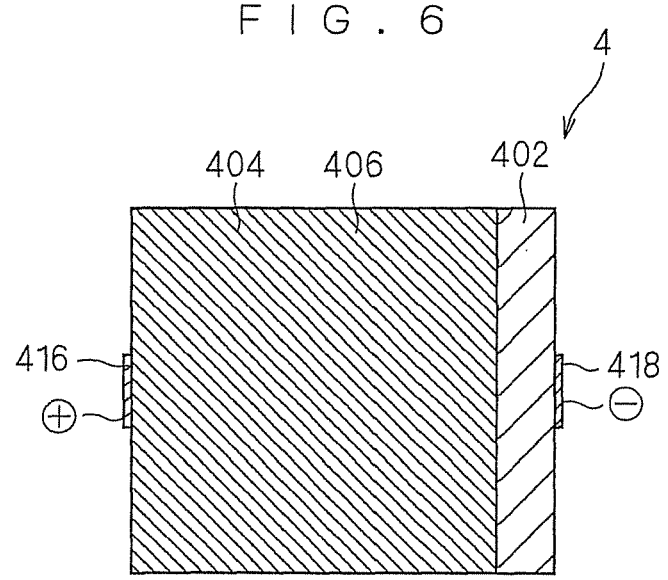
FIG. 6 is a transverse sectional view of a piezoelectric/electrostrictive actuator.

FIG. 4 to FIG. 6 show schematic drawings of structure examples of a piezoelectric/electrostrictive actuator 4 using the above-mentioned piezoelectric/electrostrictive ceramic composition and FIG. 4 is a perspective view of the piezoelectric/electrostrictive actuator 4; FIG. 5 is a longitudinal sectional view of the piezoelectric/electrostrictive actuator 4; and FIG. 6 is a transverse sectional view of the piezoelectric/electrostrictive actuator 4.

Figure 7:
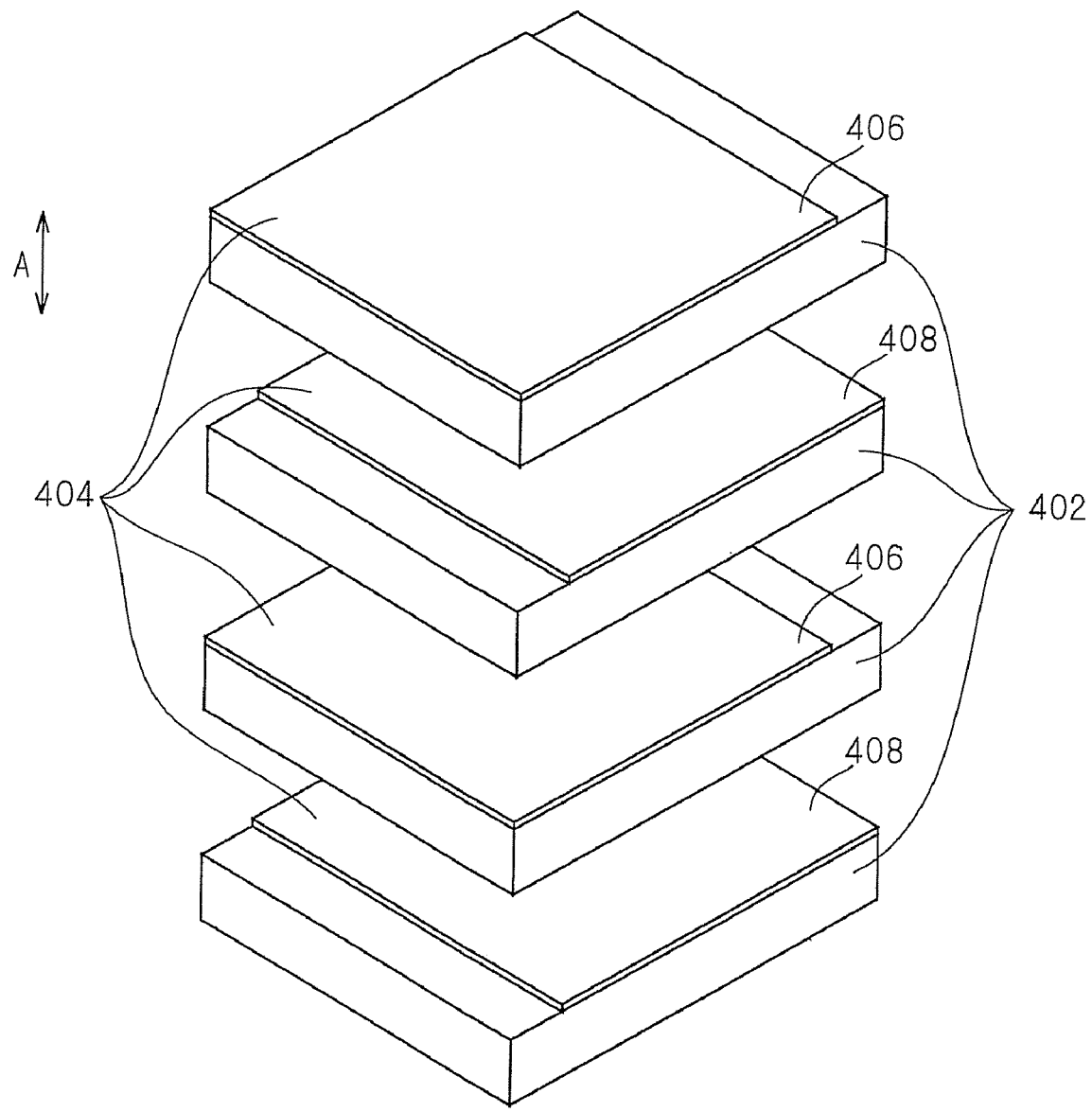
FIG. 7 is an exploded perspective view of a portion of a piezoelectric/electrostrictive actuator.

As shown in FIG. 4 to FIG. 6, the piezoelectric/electrostrictive actuator 4 has a structure formed by alternately layering the piezoelectric/electrostrictive film 402 and an inner electrode film 404 in the direction of the axis A and having outer electrode films 416 and 418 formed in end faces 412 and 414 of the laminated body 410 of the piezoelectric/electrostrictive film 402 and the inner electrode film 404. As shown in FIG. 7 of an exploded perspective view showing a portion of the piezoelectric/electrostrictive actuator 4 is disassembled in the direction of the axis A, the inner electrode film 404 includes a first inner electrode film 406 which reaches the end face 412 but not the end face 414 and a second inner electrode film 408 which reaches the end face 414 but not the end face 412. The first inner electrode film 406 and the second inner electrode film 408 are alternately formed. The first inner electrode film 406 is brought into contact with the outer electrode film 416 on the end face 412 and electrically connected with the outer electrode film 416. The second inner electrode film 408 is brought into contact with the outer electrode film 418 on the end face 414 and electrically connected with the outer electrode film 418. Accordingly, when the outer electrode film 416 is connected to the plus side of an driving signal source and the outer electrode film 418 is connected to the minus side of the driving signal source, driving signals are applied to the first inner electrode film 406 and the second inner electrode film 408 opposed together, between which the piezoelectric/electrostrictive film 402 is inserted and an electric field is applied to the piezoelectric/electrostrictive film 402 in the thickness direction. As a result, the piezoelectric/electrostrictive film 402 is expanded and contracted in the thickness direction and the laminated body 410 is deformed into the shape shown by the dotted line shown in FIG. 4 as a whole.

Different from the piezoelectric/electrostrictive actuators 1 to 3 described already, the piezoelectric/electrostrictive actuator 4 comprises no substrate to which the laminated body 410 is firmly stuck. Further, the piezoelectric/electrostrictive actuator 4 is called also as "offset type piezoelectric/electrostrictive actuator" since the first inner electrode film 406 and the second inner electrode film 408 with different patterns are alternately formed.

The piezoelectric/electrostrictive film 402 is a sintered body of the above-mentioned piezoelectric/electrostrictive ceramic composition. The thickness of the piezoelectric/electrostrictive film 402 is preferably 5 to 500 µm. That is because if it is below the range, it becomes difficult to produce green sheets described below. Further, that is because if it exceeds the range, it becomes difficult to apply a sufficient electric field to the piezoelectric/electrostrictive film 402.

Materials for the inner electrode film 404 and the outer electrode films 416 and 418 are metals such as platinum, palladium, rhodium, gold, or silver or their alloys. Among them, for the material of the inner electrode film 404, in terms of the high resistance to heat during firing and easiness of co-sintering with piezoelectric/electrostrictive film 402, platinum or an alloy containing mainly platinum is preferred. Further, depending on the firing temperature, an alloy such as silver-palladium alloy may be also preferably used.

The thickness of the inner electrode film 402 is preferably 10 µm or less. That is because if it exceeds the range, the inner electrode film 402 works as a buffer layer and the flexion displacement tends to be small. Further, for proper performance of the function of the inner electrode film 402, the thickness is even more preferably 0.1 µm or more.

Although FIG. 4 to FIG. 6 show the case of 10 layers of the piezoelectric/electrostrictive film 402, the piezoelectric/electrostrictive films 402 may be 9 layers or less or 11 layers or more.

In production of the piezoelectric/electrostrictive actuator 4, at first, a ceramic powder of the above-mentioned piezoelectric/electrostrictive ceramic composition is mixed with a plasticizer, a dispersant, and dispersion medium by a ball mill or the like. Thereafter, the obtained slurry is formed into a sheet by a doctor blade method or the like to obtain a green sheet.

Successively, the green sheet is punched by using a punch and a die in order to form holes or the like in the green sheet for positioning.

Further continuously, an electrode paste is applied to the surface of the green sheet by screen printing or the like to obtain a green sheet on which patterns of the electrode paste are formed. The patterns of the electrode paste include two types: that is, a pattern of the first electrode paste to be the first inner electrode film 406 after firing and a pattern of the second electrode paste to be the second inner electrode film 408 after firing. Of course, only one kind of pattern of the electrode paste may be formed and every other green sheet is turned at 180° to obtain the inner electrode films 406 and 408 after firing.

Next, green sheets on which the patterns of the first electrode paste are formed and green sheets on which the patterns of the second electrode pastes are formed are alternately layered, and a green sheet to which no electrode paste is applied is further layered on the top, and then the layered green sheets are pressurized and bonded in the thickness direction. At that time, the positions of the positioning holes formed on the green sheets are conformed. Further, in pressure bonding of the layered green sheets, it is also desirable to carry out pressure bonding of the green sheet with it heated by pre-heating the die to be used for pressure bonding.

The pressure-bonded body of the green sheets obtained in such a manner is fired and the obtained sintered body is processing by a dicing saw or the like to obtain a laminated body 410. Thereafter, outer electrode films 416 and 418 are formed in the end faces 412 and 414 of the laminated body 410 by baking, deposition, sputtering or the like and polarization treatment is carried out to obtain the piezoelectric/electrostrictive actuator 4.

EXAMPLES

Hereinafter, Examples 1 to 8 of piezoelectric/electrostrictive ceramic compositions of the invention and Comparative Examples 1 to 8 of piezoelectric/electrostrictive ceramic compositions out of the scope of the invention will be explained. However, the following Examples should not be considered to limit the scope of the invention.

{Production of Piezoelectric/Electrostrictive Devices for Evaluation}

In production of piezoelectric/electrostrictive devices for evaluation, at first starting materials such as lithium carbonate ($Li_2CO_3$), sodium tartarate monohydrate ($C_4H_5O_6Na.H_2O$), potassium tartarate ($C_4H_5O_6K$), niobium oxide ($Nb_2O_5$), tantalum oxide ($Ta_2O_5$), antimony oxide ($Sb_2O_3$) were weighed to give the compositions as shown in Table 1 to Table 3. In Table 1 to Table 3, x, y, z, w, and a are parameters of the general formula $\{Li_y(Na_{1-x}K_x)_{1-y}\}_a(Nb_{1-z-w}Ta_zSb_w)O_3$ and the Mn amount is the addition amount relative to 100 parts by mole of the perovskite type oxide defined by the above-mentioned general formula.

TABLE 1

|  | x | y | z | w | a | Mn amount (parts by mole) | $S_{4000\,(ppm)}$ Around room temperature | $S_{4000\,(ppm)}$ Around $T_{OT}$ | $d_{31\,(pm/V)}$ | $T_{OT\,(°C.)}$ | Lattice strain parameter |
|---|---|---|---|---|---|---|---|---|---|---|---|
| Example 1 | 0.45 | 0.06 | 0.082 | 0.01 | 1.01 | 0.02 | 528 | 528 | 68 | 46 | 1.019 |
| Example 2 | 0.45 | 0.06 | 0.082 | 0.02 | 1.01 | 0.02 | 533 | 533 | 78 | 46 | 1.017 |
| Example 3 | 0.45 | 0.06 | 0.082 | 0.04 | 1.01 | 0.02 | 577 | 577 | 90 | 45 | 1.015 |
| Example 4 | 0.45 | 0.06 | 0.082 | 0.05 | 1.01 | 0.02 | 525 | 525 | 79 | 52 | 1.013 |
| Example 5 | 0.45 | 0.06 | 0.082 | 0.06 | 1.01 | 0.02 | 388 | 576 | 68 | 60 | 1.013 |
| Example 6 | 0.45 | 0.06 | 0.082 | 0.08 | 1.01 | 0.02 | 339 | 620 | 71 | 72 | 1.007 |
| Example 7 | 0.45 | 0.06 | 0.082 | 0.10 | 1.01 | 0.02 | 380 | 602 | 75 | 95 | 1.006 |
| Comparative Example 1 | 0.45 | 0.06 | 0.082 | 0.12 | 1.01 | 0.02 | 279 | 411 | 36 | 110 | 1.002 |
| Example 8 | 0.45 | 0.06 | 0.082 | 0.04 | 1.01 | 0.10 | 601 | 601 | 88 | 50 | 1.015 |

TABLE 2

|  | x | y | z | w | a | Mn amount (parts by mole) | $S_{4000\,(ppm)}$ Around room temperature | $S_{4000\,(ppm)}$ Around $T_{OT}$ | $d_{31\,(pm/V)}$ | $T_{OT\,(°C.)}$ | Lattice strain parameter |
|---|---|---|---|---|---|---|---|---|---|---|---|
| Comparative Example 2 | 0.45 | 0.06 | 0.082 | 0.01 | 1.01 | 0.00 | 453 | 453 | 67 | 46 | 1.019 |
| Comparative Example 3 | 0.45 | 0.06 | 0.082 | 0.02 | 1.01 | 0.00 | 488 | 488 | 72 | 47 | 1.017 |
| Comparative Example 4 | 0.45 | 0.06 | 0.082 | 0.04 | 1.01 | 0.00 | 512 | 512 | 85 | 43 | 1.015 |
| Comparative Example 5 | 0.45 | 0.06 | 0.082 | 0.06 | 1.01 | 0.00 | 328 | 515 | 68 | 58 | 1.013 |
| Comparative Example 6 | 0.45 | 0.06 | 0.082 | 0.08 | 1.01 | 0.00 | 322 | 580 | 66 | 60 | 1.007 |
| Comparative Example 7 | 0.45 | 0.06 | 0.082 | 0.10 | 1.01 | 0.00 | 355 | 530 | 69 | 84 | 1.006 |
| Comparative Example 8 | 0.45 | 0.06 | 0.082 | 0.12 | 1.01 | 0.00 | 287 | 408 | 38 | 105 | 1.002 |

TABLE 3

|  | x | y | z | w | a | Mn amount (parts by mole) | $S_{4000\,(ppm)}$ Around room temperature | $S_{4000\,(ppm)}$ Around $T_{OT}$ | $d_{31\,(pm/V)}$ | $T_{OT\,(°C.)}$ | Lattice strain parameter |
|---|---|---|---|---|---|---|---|---|---|---|---|
| Example 9 | 0.45 | 0.05 | 0.160 | 0.01 | 1.01 | 0.02 | 569 | 569 | 72 | 43 | 1.018 |
| Example 10 | 0.45 | 0.05 | 0.160 | 0.02 | 1.01 | 0.02 | 540 | 540 | 81 | 39 | 1.016 |
| Example 11 | 0.45 | 0.05 | 0.160 | 0.04 | 1.01 | 0.02 | 610 | 610 | 111 | 29 | 1.013 |
| Example 12 | 0.45 | 0.05 | 0.160 | 0.06 | 1.01 | 0.02 | 630 | 630 | 123 | 27 | 1.011 |
| Example 13 | 0.45 | 0.07 | 0 | 0.01 | 1.01 | 0.02 | 573 | 573 | 60 | 30 | 1.025 |
| Example 14 | 0.45 | 0.07 | 0 | 0.02 | 1.01 | 0.02 | 614 | 614 | 70 | 55 | 1.021 |
| Example 15 | 0.45 | 0.07 | 0 | 0.04 | 1.01 | 0.02 | 350 | 621 | 58 | 71 | 1.018 |
| Example 16 | 0.45 | 0.07 | 0 | 0.06 | 1.01 | 0.02 | 300 | 580 | 57 | 90 | 1.015 |
| Example 17 | 0.45 | 0.07 | 0.082 | 0.04 | 1.005 | 0.02 | 576 | 576 | 85 | 25 | 1.016 |

TABLE 3-continued

|  | x | y | z | w | a | Mn amount (parts by mole) | $S_{4000\,(ppm)}$ Around room temperature | $S_{4000\,(ppm)}$ Around $T_{OT}$ | $d_{31\,(pm/V)}$ | $T_{OT(°\,C.)}$ | Lattice strain parameter |
|---|---|---|---|---|---|---|---|---|---|---|---|
| Example 18 | 0.45 | 0.06 | 0.082 | 0.04 | 1.02 | 0.02 | 521 | 580 | 71 | 51 | 1.010 |
| Example 19 | 0.45 | 0.06 | 0.082 | 0.04 | 1.03 | 0.02 | 280 | 550 | 52 | 100 | 1.005 |
| Example 20 | 0.30 | 0.06 | 0.082 | 0.04 | 1.01 | 0.02 | 515 | 535 | 71 | 51 | 1.021 |
| Example 21 | 0.70 | 0.06 | 0.082 | 0.04 | 1.01 | 0.02 | 512 | 512 | 78 | 21 | 1.020 |

Successively, an alcohol as a dispersion medium was added to the starting materials and mixed for 16 hours by a ball mill. Further continuously, after the obtained starting material mixtures were dried, the starting material mixtures were calcined at 800° C. for 5 hours and pulverized by a ball mill repeatedly twice to obtain ceramic powders of the piezoelectric/electrostrictive ceramic compositions. Further, $MnO_2$ in an amount shown in Table 1 to Table 3 was added to the ceramic powders of Examples 1 to 21 and Comparative Example 1.

Next, after the ceramic powders were coarsely pulverized, the powders were sieved by a sieve of 500 meshes to adjust the particle size.

The ceramic powders obtained in such a manner were compacted into a circular shape with a diameter of 18 mm and thickness of 5 mm by pressure of $2.0\times10^8$ Pa. Thereafter, each compacted body was housed in an aluminum container and fired at 950 to 1050° C. for 3 hours to obtain sintered body (piezoelectric/electrostrictive body).

Successively, each sintered body was processed into rectangular shape of longer side 12 mm×shorter side 3 mm×thickness 1 mm and thermally treated at 600 to 900° C. Thereafter, a gold electrode was formed by sputtering on both main faces of each rectangular sample. Thereafter, the sample was immersed in silicon oil and voltage of 5 kV/mm was applied to the gold electrodes in both main faces for 15 minutes to carry out polarization treatment.

{Electric Properties and Temperature Properties}

Using the piezoelectric/electrostrictive devices for Examples 1 to 8 and Comparative Examples 1 to 8 subjected to firing at 1000° C., the piezoelectric constant $d_{31}$ (pm/V) and strain ratio $S_{4000}$ (ppm) around room temperature, and phase transition temperature $T_{OT}$ were measured. The measurement results are shown in Table 1 to Table 3. The piezoelectric constant $d_{31}$ was measured by measuring the frequency-impedance characteristic and electrostatic capacity of each piezoelectric/electrostrictive device by an impedance analyzer and at the same time the size of the piezoelectric/electrostrictive device by a micrometer and carrying out calculation from the resonance frequency and the antiresonance frequency of the fundamental wave of the vibration expanding in the longitudinal direction, the electrostatic capacity, and the size. The strain ratio $S_{4000}$ is obtained by measuring electric field-induced strain in the longitudinal direction by a strain gauge stuck to the electrodes when voltage of 4 kV/mm was applied to the gold electrode on both main faces. A measurement method of the phase transition temperature $T_{OT}$ will be described later.

The above-mentioned piezoelectric/electrostrictive ceramic compositions were well sintered at least in a range of 950 to 1050° C. and since the piezoelectric/electrostrictive property tendency of the piezoelectric/electrostrictive devices fired at 970° C. and 1030° C. was found same as that of the piezoelectric/electrostrictive devices fired at 1000° C., only the piezoelectric/electrostrictive properties in the case of firing at 1000° C. are shown in Table 1 to Table 3.

With reference to Table 1 and Table 2, as being made clear in comparison of Examples 1 to 3, 5 and 6 and Comparative Examples 2 to 7, in the case the Sb substitution amount was in a range of $0.01 \leq w \leq 0.10$, the strain ratio $S_{4000}$ could remarkably be improved by adding 0.02 parts by mole (0.02 parts by mole based on Mn atom) of a Mn compound to 100 parts by mole of the perovskite type oxide defined by the general formula: $\{Li_{0.06}(Na_{0.55}K_{0.45})_{0.94}\}_{1.01}(Nb_{0.918-w}Ta_{0.082}Sb_w)O_3$. Further, as being made clear from Examples 3 and 8 and Comparative Example 4, the strain ratio $S_{4000}$ could be improved by successively increasing the addition amount of the Mn compound to be 0, 0.02 to 0.1 parts by mole (0, 0.02, and 0.1 parts by mole based on Mn atom) to 100 parts by mole of the perovskite type oxide defined by the chemical formula: $\{Li_{0.06}(Na_{0.55}K_{0.45})_{0.94}\}_{1.01}(Nb_{0.878}Ta_{0.082}Sb_{0.04})O_3$ wherein the Sb substitution amount w=0.04.

However, as being made clear in comparison of Comparative Example 1 and Comparative Example 8, the strain ratio $S_{4000}$ could not be improved even if 0.02 parts by mole (0.02 parts by mole based on Mn atom) of the Mn compound was added to 100 parts by mole of the perovskite type oxide defined by the chemical formula: $\{Li_{0.06}(Na_{0.55}K_{0.45})_{0.94}\}_{1.01}(Nb_{0.798}Ta_{0.082}Sb_{0.12})O_3$ wherein the Sb substitution amount w=0.12.

Further, good strain ratio $S_{4000}$ could be obtained in Examples 9 to 12 in which the Li substitution amount was decreased (y=0.06→0.05) and the Ta substitution amount was increased (z=0.082→0.160) as compared with Examples 1 to 3 and 5; Examples 13 to 16 in which the Li substitution amount was increased (y=0.06→0.07) and the Ta substitution amount was decreased (z=0.082→0) as compared with Examples 1 to 3 and 5; Examples 17 to 19 in which the A/B ratio was increased or decreased (a=1.01→1.005 to 1.03) more than that of Example 3; and Examples 13 and 14 in which the K amount was increased or decreased (x=0.45→0.3 to 0.7), excluding Example 19 in which whatever hetero-phase was supposedly produced.

In addition, as being made clear from Examples 1 to 7, particularly good strain ratio $S_{4000}$ could be obtained at around room temperature in a case the Sb substitution amount was in a range of $0.01 \leq w \leq 0.05$.

Figure 8:
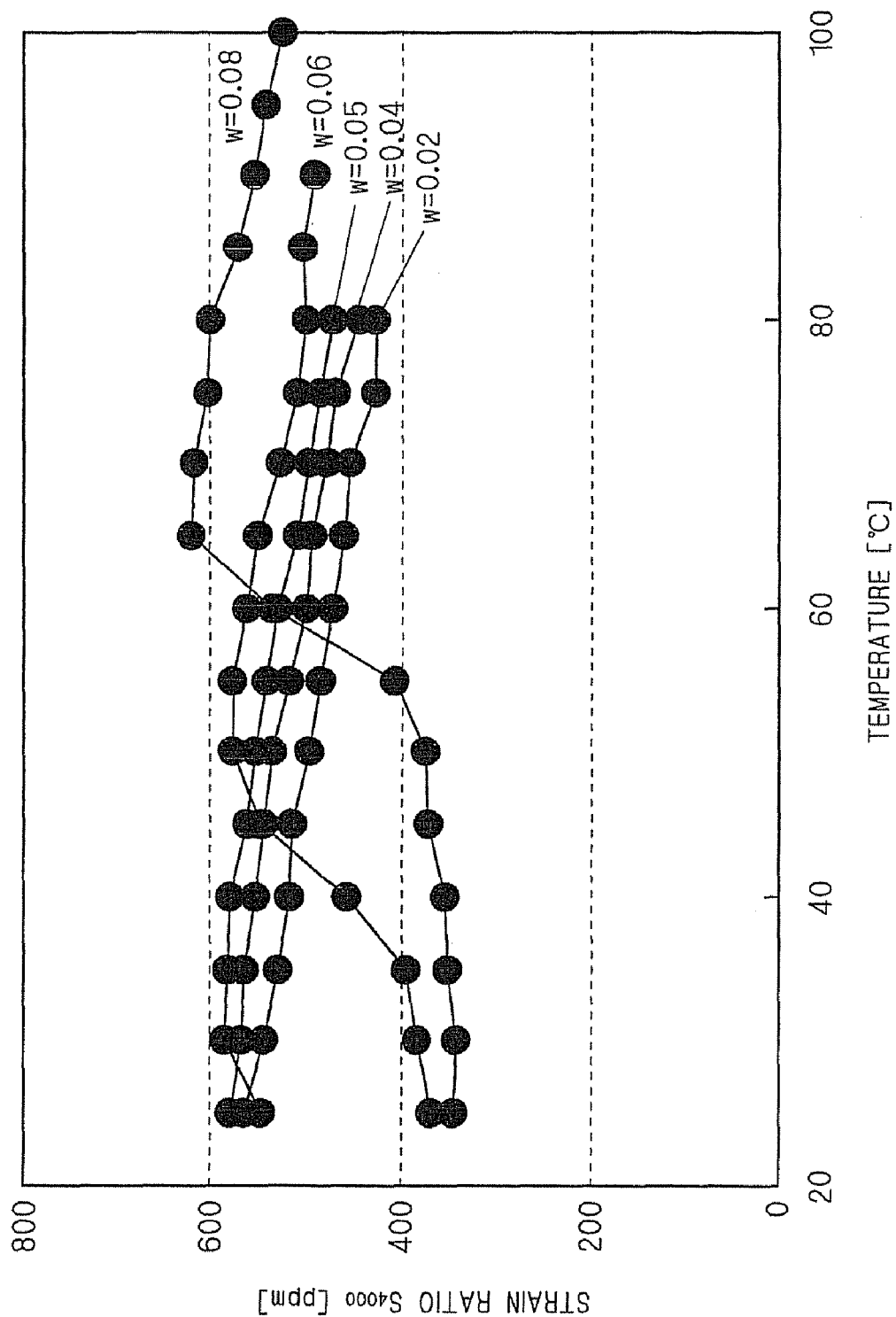
FIG. 8 is a graph showing the fluctuation of strain ratio in relation to temperature.

FIG. 8 shows the fluctuation of the strain ratio $S_{4000}$ in relation to the temperature for Examples 2 to 6 in w the Sb substitution amount w was 0.02, 0.04, 0.05, 0.06, and 0.08.

As being shown in FIG. 8, in the case 0.02 parts by mole of $MnO_2$ was added to 100 parts by mole of the perovskite type oxide defined by a general formula $\{Li_{0.06}(Na_{0.55}K_{0.45})_{0.94}\}_{1.01}(Nb_{0.918-w}Ta_{0.082}Sb_w)O_3$, if the Sb substitution amount w was in a range of $w \leq 0.5$, the temperature at which the strain ratio $S_{4000}$ became the maximum was scarcely changed even if the Sb substitution amount was increased, whereas the temperature at which the strain ratio $S_{4000}$ became the maximum was increased along with the increase of the Sb substitution amount if the Sb substitution amount exceeded the range. Therefore, in the case 0.02 parts by mole of Mn compound was added to 100 parts by mole of the perovskite type oxide defined by a general formula $\{Li_{0.06}(Na_{0.55}K_{0.45})_{0.94}\}_{1.01}(Nb_{0.918-w}Ta_{0.082}Sb_w)O_3$, if the Sb substitution amount w was in a range of w≦0.5, a high strain ratio $S_{4000}$ could be obtained without changing the temperature properties, whereas the temperature properties tended to be changed more as the Sb substitution amount was increased more in the case the Sb substitution amount exceeded the range.

Figure 9:
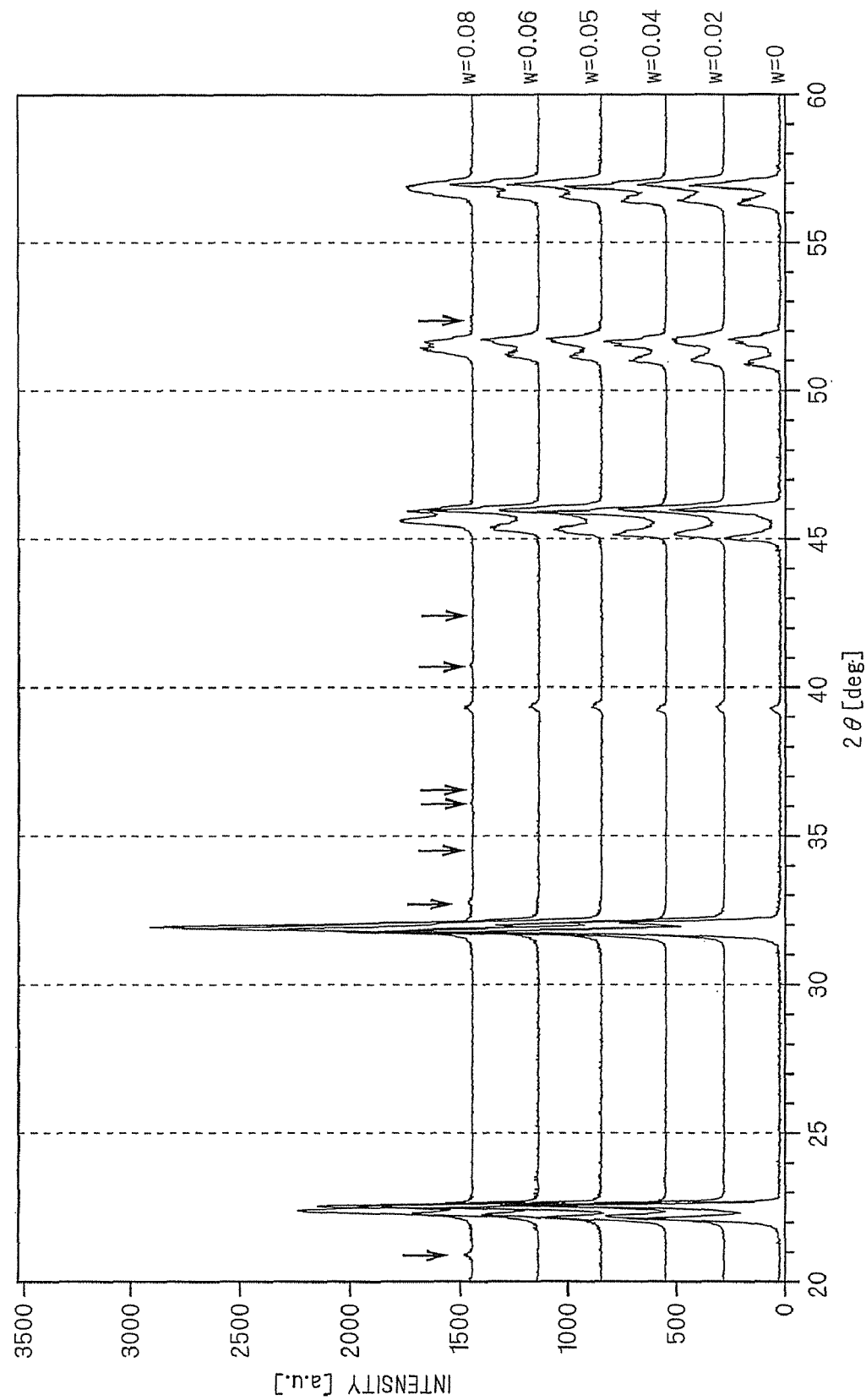
FIG. 9 is a graph showing the X-ray diffraction pattern of a sintered body.

FIG. 9 shows a graph showing the X-ray diffraction patterns of sintered bodies used for the piezoelectric/electrostrictive devices of Examples 2 to 6 in which the Sb substitution amount w was 0.02, 0.04, 0.05, 0.06 and 0.08. FIG. 9 also shows a graph of the X-ray diffraction pattern of the sintered body in which the Sb substitution amount w=0.

Each processed sample was set in a manner that X-rays were irradiated to the surface of 12 mm×3 mm and the X-ray diffraction patterns of the sample was measured in a range of 20° to 60° by 2θ/θ method. The X-ray diffraction patterns were measured using an X-ray diffractometer, a Cu—Kα ray as an irradiation source, and a graphite monochromater installed before a detector. The X-ray irradiation conditions were 35 kV-30 mA, scanning width 0.02°, scanning speed 2°/min, radiation slit 1°, and light reception slit 0.3 mm and it was confirmed that two peaks with high intensity existed in a range of 2θ=44° to 47°. At that time, in the case the peak intensity in the higher angle side was about two times as high as the peak intensity in the lower angle side, it can be determined that mainly tetragonal and the peak in the lower angle side was of (002) plane and the peak in the higher angle side was of (200) plane.

As shown in FIG. 9, in the case the Sb substitution amount was in a range of 0≦w≦0.06, the X-ray diffraction pattern particular for the tetragonal of perovskite was observed and the crystal system of the sintered body was found to be tetragonal. On the other hand, in the case the Sb substitution amount was w=0.08, X-ray diffraction pattern particular for the orthorhombic crystal of perovskite was observed and the crystal system of the sintered body was found to be orthorhombic.

Table 1 to Table 3 also show the lattice strain parameter, which is the ratio of two d-spacings calculated by a half-value width mean method from two peaks with high intensity observed in the range of 2θ=44° to 47° in the X-ray diffraction pattern of each sintered body used for the piezoelectric/electrostrictive devices of Examples 1 to 21 and Comparative Examples 1 to 8. The "lattice strain parameter" is an index value showing the degree of the lattice strain and in the case the crystal system is the tetragonal, it approximately mean the ratio of the d-spacing of the (002) plane to the d-spacing of the (200) plane.

As shown in Examples 1 to 7 to Comparative Example 1, the lattice strain parameter was decreased more as the Sb substitution amount was increased more and in the case the Sb substitution amount was in a range of 0.01≦w≦0.10, it became 1.003 or higher and 1.025 or lower.

In addition, in the (Li, Na, K)(Nb, Ta, Sb)O₃ type piezoelectric/electrostrictive ceramic composition, even if the compositions other than Examples 2 to 6, in the case the crystal system was tetragonal or orthorhombic and the lattice strain parameter was 1.003 or higher and 1.02 or lower, the rotation of the domain became easy and the strain ratio $S_{4000}$ could be improved. It can be supposed from the fact that the increase of the strain ratio $S_{4000}$ was significant as compared with the increase of the piezoelectric constant in Table 1 and Table 2. Actually, even in the case of Examples 9 to 21 in which the strain ratio $S_{4000}$ was good, the lattice strain parameter was 1.003 or higher and 1.025 or lower.

Further, as shown in FIG. 8, in the case the Sb substitution amount was in a range of 0≦w≦0.06, no peak derived from a hetero-phase was observed; however in the case the Sb substitution amount was w=0.08, a peak derived from a hetero-phase as shown by an arrow could be observed. This heterophase was supposed to be $LiSbO_3$. When the polished face of the sintered body used for the piezoelectric/electrostrictive device of Example 6 was observed by SEM (Scanning Electron Microscope), needle-like crystal was observed and when the constituent components of the needle-like crystal was observed by EDS (energy dispersive X-ray spectrometer), it was found that a large quantity of Sb was contained. It proved that the peak of the hetero-phase observed in the X-ray diffraction pattern was derived from $LiSbO_3$.

The Sb substitution amount sufficient to observe the peak derived from such a hetero-phase was slightly fluctuated in accordance with the perovskite type oxide composition and added amount of the Mn compound. However, if the Sb substitution amount was in a range of 0≦w≦0.05, regardless of the perovskite type oxide composition and added amount of the Mn compound, no peak derived from the hetero-phase could be observed. Actually, no hetero-phase of $LiSbO_3$ was observed in Examples 9 to 11, 13 to 15, and 17 to 21.

Next, the phase transition temperature $T_{OT}$ of each sintered body used for the piezoelectric/electrostrictive devices of Examples 1 to 21 and Comparative Examples 1 to 8 was measured. The measurement results are shown in Table 1 and Table 3. The phase transition temperature $T_{OT}$ was calculated by measuring the temperature dependency of the specific dielectric constant $\in/\in_0$ by an impedance analyzer. As being made clear from the measurement results, in the case the Sb substitution amount was in a range of 0≦w≦0.05, scarcely changing the phase transition temperature $T_{OT}$ and without changing the temperature characteristic as described in the explanation of FIG. 8, the strain ratio $S_{4000}$ could be increased as a whole. However, if the Sb substitution amount exceeded the range, the phase transition temperature was increased and as a result, the temperature characteristic was changed and accordingly the strain ratio $S_{4000}$ was decreased. Such increase of the phase transition temperature $T_{OT}$ was supposedly attributed to that formation of the hetero-phase of $LiSbO_3$ induced decrease of the Li amount contained in the perovskite phase.

While the invention has been shown and described in detail, the foregoing description is in all aspects illustrative and not restrictive. It is therefore understood that numerous modifications and variations can be devised without departing from the scope of the invention.

What is claimed is:

1. A piezoelectric/electrostrictive ceramic composition comprising:
   a perovskite type oxide comprising as A site elements, Li, Na, and K and as B site elements, Nb and Sb and having a ratio of the total number of atoms of the A site elements to the total number of atoms of the B site elements greater than 1 and not less than 1 mol % and not more than 10 mol % of the number of Sb atoms in the total number of atoms of the B site elements; and
   a Mn compound added to said perovskite type oxide, wherein between two main peaks derived from said perovskite type oxide and observed in a range of 2θ=44 to 47° in an X-ray diffraction pattern using Cu—Kα beam as an X-ray source, a ratio of d-spacing calculated from a peak in the lower angle side to the d-spacing calculated from a peak in a higher angle side is not less than 1.003 and not more than 1.025.

2. The piezoelectric/electrostrictive ceramic composition according to claim 1, wherein said perovskite type oxide further comprising Ta as a B site element.

3. The piezoelectric/electrostrictive ceramic composition according to claim 1, wherein the addition amount of said Mn compound is not more than 3 parts by mole on the basis of Mn atom to 100 parts by mole of said perovskite type oxide.

4. The piezoelectric/electrostrictive ceramic composition according to claim 1, wherein said piezoelectric/electrostrictive ceramic composition contains no hetero-phase of $LiSbO_3$.

5. A piezoelectric/electrostrictive ceramic composition comprising:
 a perovskite type oxide having a composition defined by a general formula: $\{Li_y(Na_{1-x}K_x)_{1-y}\}_a(Nb_{1-z-w}Ta_zSb_w)O_3$ wherein a, x, y, z, and w respectively satisfy $1<a\leq1.05$, $0.30\leq x\leq0.70$, $0.02\leq y\leq0.10$, $0\leq z\leq0.5$, and $0.01\leq w\leq0.1$; and
 a Mn compound added to said perovskite type oxide,
 wherein between two main peaks derived from said perovskite type oxide and observed in a range of $2\theta=44$ to $47°$ in an X-ray diffraction pattern using Cu—Kα beam as an X-ray source, a ratio of d-spacing calculated from a peak in the lower angle side to the d-spacing calculated from a peak in a higher angle side is not less than 1.003 and not more than 1.025.

6. The piezoelectric/electrostrictive ceramic composition according to claim 5, wherein the addition amount of said Mn compound is not more than 3 parts by mole on the basis of Mn atom to 100 parts by mole of said perovskite type oxide.

7. The piezoelectric/electrostrictive ceramic composition according to claim 5, wherein said piezoelectric/electrostrictive ceramic composition comprises no hetero-phase of $LiSbO_3$.

8. A piezoelectric/electrostrictive ceramic composition comprising;
 a perovskite type oxide comprising as A site elements, Li, Na, and K and as B site elements, Nb and Sb and having a ratio of the total number of atoms of the A site elements to the total number of atoms of the B site elements greater than 1; and
 a Mn compound added to said perovskite type oxide,
 wherein between two main peaks derived from said perovskite type oxide and observed in a range of $2\theta=44$ to $47°$ in an X-ray diffraction pattern using Cu—Kα beam as an X-ray source, a ratio of d-spacing calculated from a peak in a lower angle side to the d-spacing calculated from a peak in a higher angle side is not less than 1.003 and not more than 1.025.

9. The piezoelectric/electrostrictive ceramic composition according to claim 8, wherein said piezoelectric/electrostrictive ceramic composition comprising no hetero-phase of $LiSbO_3$.

10. A piezoelectric/electrostrictive device comprising:
 a piezoelectric/electrostrictive film of a sintered body of a piezoelectric/electrostrictive ceramic composition; and
 electrode films on both main faces of said piezoelectric/electrostrictive film,
 wherein said piezoelectric/electrostrictive ceramic composition comprises a perovskite type oxide comprising as A site elements, Li, Na, and K and as B site elements, Nb and Sb and having a ratio of the total number of atoms of the A site elements to the total number of atoms of the B site elements greater than 1 and not less than 1 mol % and not more than 10 mol % of the number of Sb atoms in the total number of atoms of the B site elements and a Mn compound added to said perovskite type oxide,
 wherein between two main peaks derived from said perovskite type oxide and observed in a range of $2\theta=44$ to $47°$ in an X-ray diffraction pattern using Cu—Kα beam as an X-ray source a ratio of d-spacing calculated from a peak in the lower angle side to the d-spacing calculated from a peak in a higher angle side is not less than 1.003 and not more than 1.025.

11. The piezoelectric/electrostrictive device according to claim 10, wherein said piezoelectric/electrostrictive film comprises no hetero-phase of $LiSbO_3$.

12. A piezoelectric/electrostrictive device comprising:
 a piezoelectric/electrostrictive film of a sintered body of a piezoelectric/electrostrictive ceramic composition; and
 electrode films on both main faces of said piezoelectric/electrostrictive film,
 wherein said piezoelectric/electrostrictive ceramic composition comprises a perovskite type oxide having a composition defined by a general formula: $\{Li_y(Na_{1-x}K_x)_{1-y}\}_a(Nb_{1-z-w}Ta_zSb_w)O_3$ wherein a, x, y, z, and w respectively satisfy $1<a\leq1.05$, $0.30\leq x\leq0.70$, $0.02\leq y\leq0.10$, $0\leq z\leq0.5$, and $0.01\leq w\leq0.1$, and a Mn compound added to said perovskite type oxide,
 wherein between two main peaks derived from said perovskite type oxide and observed in a range of $2\theta=44$ to $47°$ in an X-ray diffraction pattern using Cu—Kα beam as an X-ray source, a ratio of d-spacing calculated from a peak in the lower angle side to the d-spacing calculated from a peak in a higher angle side is not less than 1.003 and not more than 1.025.

13. The piezoelectric/electrostrictive device according to claim 12, wherein said piezoelectric/electrostrictive film comprises no hetro-hase of $LiSbO_3$.

14. A piezoelectric/electrostrictive device comprising:
 a piezoelectric/electrostrictive film of a sintered body of a piezoelectric/electrostrictive ceramic composition; and
 electrode films on both main faces of said piezoelectric/electrostrictive film,
 wherein said piezoelectric/electrostrictive ceramic composition comprises a perovskite type oxide comprising as A site elements, Li, Na, and K and as B site elements, Nb and Sb and having a ratio of the total number of atoms of the A site elements to the total number of atoms of the B site elements greater than 1 and a Mn compound added to said perovskite type oxide,
 wherein between two main peaks derived from said perovskite type oxide and observed in a range of $2\theta=44$ to $47°$ in an X-ray diffraction pattern using Cu—Kα beam as an X-ray source, a ratio of d-spacing calculated from a peak in a lower angle side to the d-spacing calculated from a peak in a higher angle side is not less than 1.003 and not more than 1.025.

15. The piezoelectric/electrostrictive device according to claim 14, wherein said piezoelectric/electrostrictive film comprises no hetero-phase of $LiSbO_3$.

* * * * *